US012243926B2

(12) United States Patent
Atmaca

(10) Patent No.: US 12,243,926 B2
(45) Date of Patent: Mar. 4, 2025

(54) HEMT TRANSISTOR WITH IMPROVED GATE ARRANGEMENT

(71) Applicant: COMMISSARIAT A L'ENERGIE ATOMIQUE ET AUX ENERGIES ALTERNATIVES, Paris (FR)

(72) Inventor: Gokhan Atmaca, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 568 days.

(21) Appl. No.: 17/564,831

(22) Filed: Dec. 29, 2021

(65) Prior Publication Data

US 2022/0216320 A1 Jul. 7, 2022

(30) Foreign Application Priority Data

Jan. 7, 2021 (EP) .................................... 21305017

(51) Int. Cl.
*H01L 29/47* (2006.01)
*H01L 29/20* (2006.01)
*H01L 29/205* (2006.01)
*H01L 29/778* (2006.01)

(52) U.S. Cl.
CPC ........ *H01L 29/475* (2013.01); *H01L 29/2003* (2013.01); *H01L 29/205* (2013.01); *H01L 29/7786* (2013.01)

(58) Field of Classification Search
CPC ......... H01L 29/432; H01L 29/452–454; H01L 29/4983; H01L 29/778–7789
See application file for complete search history.

(56) References Cited

U.S. PATENT DOCUMENTS

2014/0175455 A1* 6/2014 Tanimoto .............. H01L 29/778
438/197

FOREIGN PATENT DOCUMENTS

CN 109786441 A 5/2019

OTHER PUBLICATIONS

European Search Report issued Jun. 18, 2021 in European Application 21305017.2 filed Jan. 7, 2021, 1 page.
Wang et al., "E-Mode p-n Junction/AlGaN/GaN (PNJ) HEMTs", IEEE Electron Device Letters, vol. 41, No. 4, Apr. 2020, 4 pages.
Wan et al., "A highly Efficient Method to Fabricate Normally-Off AlGaN/GaN HEMTs With Low Gate Leakage via Mg Diffusion", Appl. Phys. Lett. 116, 023504, 2020, 5 pages.

(Continued)

*Primary Examiner* — Evan G Clinton
(74) *Attorney, Agent, or Firm* — Oblon, McClelland, Maier & Neustadt, L.L.P.

(57) ABSTRACT

A HEMT GaN transistor with a conductive gate including an upper metal region, and a lower semi-conductor region provided to lower current gate leakage. The lower semiconductor region is formed of: a first sub-region that is P-doped and in contact with the metal region, a second sub-region that is P-doped and in contact with the second layer, and an intermediate sub-region arranged between the first sub-region and the second sub-region, the third sub-region being un-doped or unintentionally doped or doped with a low concentration of dopant compared to that of the first sub-region and second sub-region, respectively.

11 Claims, 10 Drawing Sheets

(56) References Cited

OTHER PUBLICATIONS

Rossetto et al., "Field- and Current-Driven Degradation of GaN-Based Power HEMTs With p-GaN Gate: Dependence on Mg-Doping Level", Microelectronics Reliability 76-77, 2017, 6 pages.
Wu et al., "Forward Bias Gate Breakdown Mechanism in Enhancement-Mode p-GaN Gate AlGaN/GaN High-Electron Mobility Transistors", IEEE Electron Device Letters, vol. 36, No. 10, Oct. 2015, 3 pages.

* cited by examiner

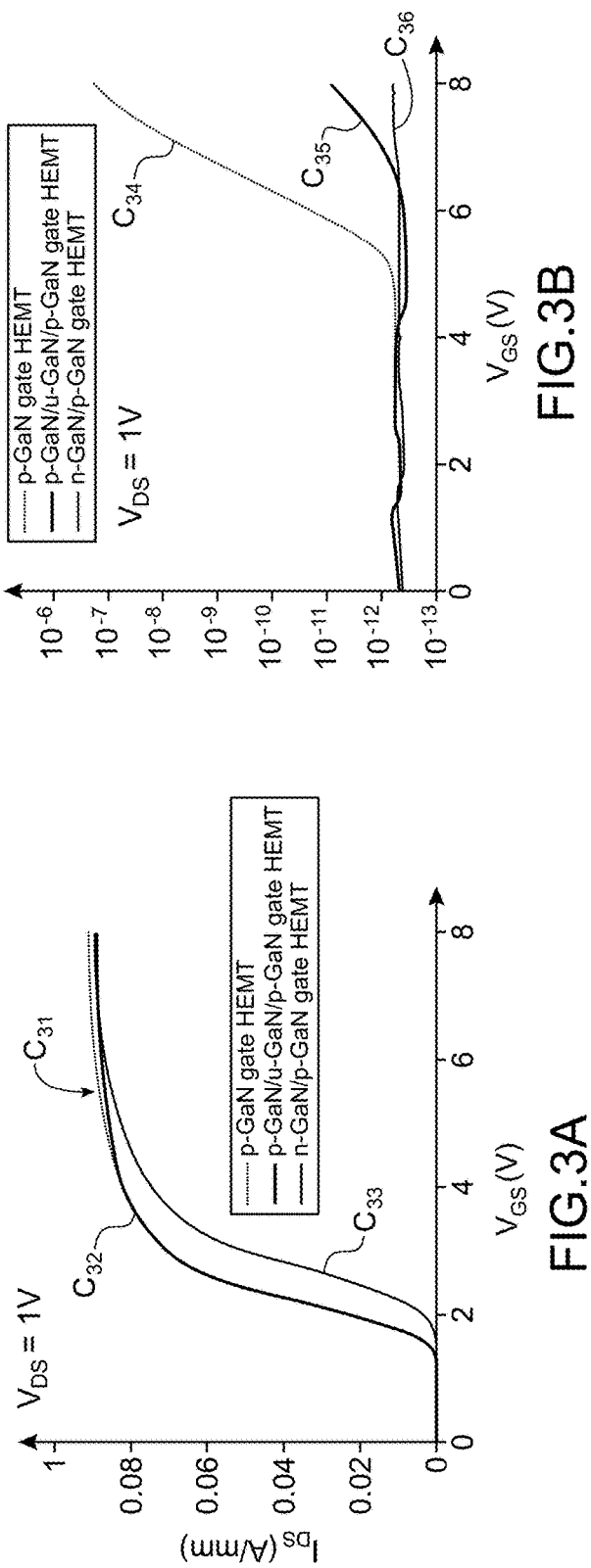
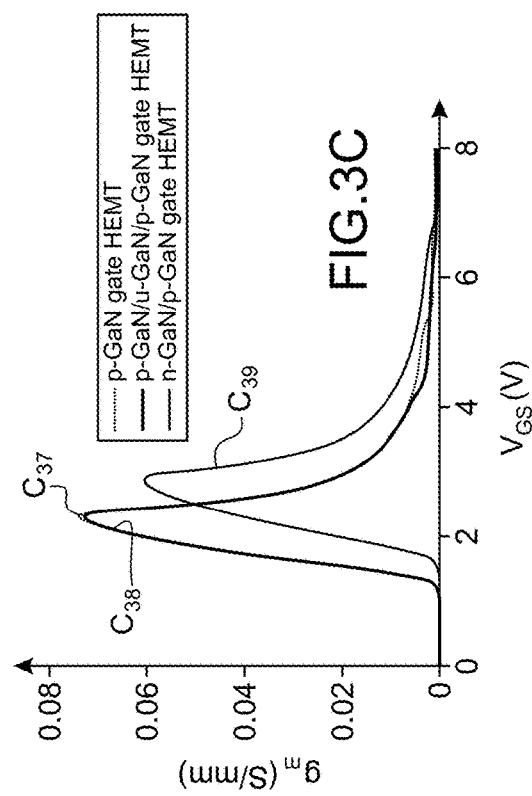
FIG.3A
FIG.3B
FIG.3C

HEMT TRANSISTOR WITH IMPROVED GATE ARRANGEMENT

TECHNICAL FIELD

The present invention pertains to the field of transistors having a channel structure that is formed of at least two layers of different bandgaps and which therefore form a hetero-structure.

It relates more particularly to a GaN-based High Electron Mobility Transistor (HEMT) with a reduced gate leakage current.

PRIOR ART

A HEMT transistor, also known as hetero-structure field effect transistors (HFET), is a transistor in which semiconductor layers with different bandgaps, for example InAlAs/InGaAs/InP or AlGaN/GaN, creating a hetero-interface are provided.

Such hetero-structure enables generation, in an electronically controllable way, of a so-called 2-dimensional gas (2DEG). HEMT transistors are characterized by the possibility of operating at high frequencies, as well as presenting high breakdown voltages.

The operating principle of the HEMT is based on the modulation of the conductance between two ohmic source and drain contacts, by the electrostatic action of a gate electrode which can control the carrier density in the two-dimensional gas. The variation of this conductance is proportional to the number of free carriers in the channel and therefore to the current between source and drain. Typically, the charge carriers are electrons, the two-dimensional gas being a 2D electron gas.

The use of an AlGaN/GaN heterojunction in such transistor is advantageous because of the high density of electrons and the high mobility of these electrons that can be obtained in the two-dimensional electron gas.

FIG. 1A shows a HEMT transistor on a substrate 2 and that is provided with such type of heterojunction. It comprises a semiconductor body 1, which in turn includes a GaN bottom layer 4 and an AlGaN top layer 6. To control the channel and therefore the current in the GaN layer 4, a gate 10 comprising a metal region 11 lying on a semiconductor region 12 and forming a Schottky contact is provided.

The semi-conductor region 12 can be a p-doped GaN portion as described for example in document: "Forward Bias Gate Breakdown Mechanism in Enhancement-Mode p-GaN Gate AlGaN/GaN High-Electron Mobility Transistors", Wu et al., IEEE Electron Device Letters, 2015. The disclosed transistor is a normally OFF transistor also called enhancement transistor.

Under high forward gate bias, this transistor with a p-doped GaN gate has a tendency to have electrons injected into the semiconductor region 12. It leads to increase the ON-state leakage current. Such a structure may further undergo avalanche breakdown under high forward gate bias.

In document "E-mode p-n Junction/AlGaN/GaN (PNJ) HEMTs", from Wang et al., IEEE Electron Device Letters, 2020, another gate structure 10' is provided in order to reduce the gate leakage current, FIG. 1B. In this gate structure 10', a thin N-type GaN layer 14 is inserted between metal region 11 and a p-GaN layer 16 that is in contact with the AlGaN top layer 6.

Due to the thin N-type GaN layer, gate metal region 11 is chosen so as to form an ohmic contact. It leads to low electric field below the gate. Due to PN junction formed by N-type layer 14 and P-type layer 16, low hole injection from gate can be obtained. It results in a low gate leakage current. However, such a structure shows a degradation on the OFF-state leakage current.

The problem then arises of finding a new heterojunction transistor structure that is preferably improved with respect to the aforementioned drawbacks.

BRIEF DESCRIPTION OF THE INVENTION

One aim of the present invention is to propose a transistor with a heterojunction, that is having a reduced gate leakage current and that does not have the drawbacks of the transistors according to the prior art, that is in particular capable of maintaining a good level of drain current with a reduced OFF-state leakage current and that is not subjected to avalanche breakdown under high forward gate bias.

For this, according to an embodiment, the present invention provides: A field effect transistor, in particular of HEMT type, including:
  a source electrode,
  a drain electrode,
  a channel region formed in a semiconductor block, the semiconductor block being provided with a hetero-structure and comprising at least a first semi-conductor layer of a first semi-conductor material having a first band gap and a second semi-conductor layer of a second semi-conductor material having a second band gap,
  a conductive gate for controlling a current flow between the source electrode and the drain electrode, the conductive gate being composed of an upper region comprising metal contacting a lower semi-conductor region,
  the lower semiconductor region being formed of:
  a first sub-region that is P-type and in contact with said upper region,
  a second sub-region that is P-type and in contact with said second layer,
  said lower semiconductor region of said conductive gate further comprising: an intermediate sub-region arranged between said first sub-region and said second sub-region, said intermediate sub-region being un-doped, or unintentionally doped, or P-doped with a lower concentration of dopant compared to that of said first sub-region and second sub-region respectively.

Advantageously, the field effect transistor is a normally off type transistor.

According to a possible implementation, the first layer may be a GaN layer. The second layer may be an AlGaN layer. Thus, the heterojunction may be a GaN/AlGaN heterojunction.

According to a possibility of implementation, the lower semiconductor region of the gate may be a GaN region, the first sub-region thus being p-GaN, the second sub-region being p-GaN, the intermediate being un-doped or unintentionally doped or lightly P-doped GaN.

In the case the intermediate sub-region is P-doped with a lower concentration of dopant compared to that of said first sub-region and second sub-region respectively, intermediate sub-region is preferably lightly doped with Mg as dopant, the concentration of Mg is lower than $5*10^{17}$ cm$^{-3}$ and preferably lower than $1*10^{17}$ cm$^{-3}$ in this intermediate sub-region.

In the case the intermediate sub-region is P-doped with a lower concentration of dopant compared to that of said first sub-region and second sub-region respectively, intermediate sub-region is preferably lightly doped with Mg as dopant, the concentration of Mg being 100 times and preferably 1000 times lower than the dopant concentration in said first sub-region and second sub-region.

Intermediate sub-region has a thickness preferably comprised between 10 nm and 30 nm and more preferably before 20 nm and 30 nm.

According to a possible embodiment, first sub-region and second sub-region contain Mg as dopant, the concentration of Mg in the first sub-region and the second sub-region is higher than the Mg concentration of $5.0 \times 10^{18}$ cm$^{-3}$, the concentration of Mg in the first sub-region and in the second sub-region being typically comprised between $5.0 \times 10^{18}$ cm$^{-3}$ and $1 \times 10^{19}$ cm$^{-3}$.

The Mg concentration in said intermediate sub-region may be at 100 times lower and preferably 1000 times lower than the concentration of Mg in said first sub-region and said second sub-region, said intermediate sub-region being preferably unintentionally doped.

Advantageously, the upper region is provided with a metal having a high work function, in particular equal or higher than 4.8 eV. With a high work-function metal such as Nickel, this device still keeps the hole injection phenomena that helps increase of drain current at high gate voltages.

BRIEF DESCRIPTION OF THE DRAWINGS

The present invention will be better understood upon reading the description of example embodiments, provided purely for information and in a non-limiting way, done in reference to the appended drawings, in which:

FIGS. 3A, 3B, 3C give different "ON-state" electrical characteristics of a HEMT transistor according to the invention and of transistors according to prior art°;

Identical, similar or equivalent parts of the various figures bear the same numerical references so as to facilitate the passage from one figure to the next.

The different parts shown in the figures are not necessarily shown using a uniform scale, to make the figures more legible.

Furthermore, in the description below, terms that depend on the orientation of the structure such as "on", "above", "vertical", "lateral", "upper", "lower", apply considering that the structure is oriented in the manner illustrated in the figures.

DETAILED DISCLOSURE OF SPECIFIC EMBODIMENTS

Figure 2:
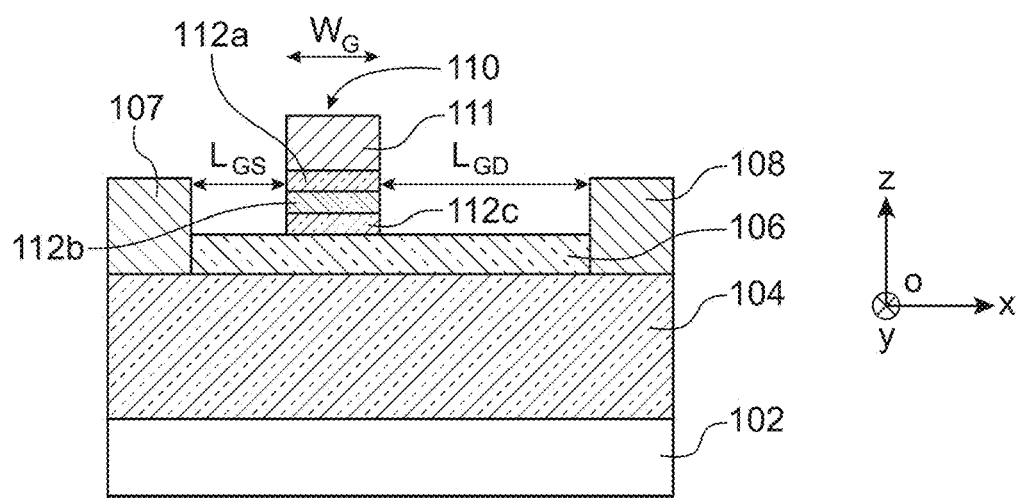
FIG. 2 illustrate a HEMT transistor with a particular gate structure according to an embodiment of the invention°.

Reference is now made to FIG. 2, which corresponds to a schematic cross-sectional view of a transistor, here of the HEMT type, comprising an heterojunction and an improved gate arrangement according to a first embodiment.

The transistor is a "Normally off" (or "n-off") also called enrichment transistor, that is to say with a positive threshold voltage and which is blocked ("Off") when its gate source voltage is zero.

The transistor is made from a semiconductor substrate 102, for example silicon-based, on which a semi-conductor block comprising the heterojunction is arranged. The substrate 102 may also comprise SiC or even $Al_2O_3$ or sapphire.

The heterojunction is made in a stack comprising a first layer 104 of a III-N semi-conductor material having a first bandgap and a second layer 106 of a III-N semi-conductor material having a second bandgap, larger than said first bandgap.

Preferably, the transistor is a GaN based transistor. Thus, the first layer 104, also called "buffer layer", may be a GaN layer, with a thickness typically chosen according to the breakdown voltage desired for the transistor. The first layer's thickness may be for example of the order of 4 μm.

The second layer 106, also called "barrier layer" may advantageously be an AlGaN layer. The second layer's thickness may be between 15 and 20 nm, for example of the order of 15 nm. The aluminium concentration of Al in the second layer 106 may be between 15% and 25%. A particular embodiment provides a layer 106 of $Al_{0.25}Ga_{0.75}N$.

Although not visible in FIG. 2, one or several transition layers used for the growth of the materials of the heterojunction may be positioned between the substrate 102 and the first layer 104. Among these transition layers, a nucleation layer for example that is GaN based, may be positioned on and in contact with the substrate 102 in order to provide an adaptation of the crystal lattice parameter. A back barrier layer for example AlGaN based and several micrometres thick may further be positioned on and in contact with the nucleation layer. An additional buffer layer, for example GaN based and several micrometres thick, may further be provided on said back barrier layer or said nucleation layer.

The transistor further includes source 107 and drain 108 electric contacts, which are arranged on and in contact with regions of the second layer 106. Each of the electric contacts 107 and 108 can be a metallic layer or a stack of metal layers. The metal of source and drain electrode is provided preferably so as to form ohmic type contacts with the second layer 106. The source and drain contacts 107, 108 may be formed from one or more of the following metals: Ti, Al, Ni, Au. According to a particular embodiment, the source drain contacts 107 and 108 may be composite electrodes made of plural metals. A particular example provides source and drain contacts 107 and 108 made of Ti/Al/Ti/Au metal stack.

A two-dimensional electron gas (not represented) can be formed in a channel region situated in the first layer 104, typically under the interface between the second layer 106 and the first layer 104.

The transistor further comprises a gate electrode 110 that is arranged in contact and here on a portion of the second layer 106 to control the two-dimensional electron gas. The gate electrode 110 is made of an upper region 111 that is metal-based and that is contacting a lower region 112 made of semi-conductor.

The semi-conductor region 112 has a particular arrangement that is provided to reduce gate current leakage.

This lower region 112, that may be for example with a thickness of 70 nm is made of a first sub-region 112a that is in contact with said metal region, said first sub-region 112a being arranged on and in contact with an intermediate sub-region 112b of different composition, the intermediate sub-region 112b being arranged on and in contact with a second sub-region 112c that is in contact with said second semi-conductor layer 106, said second sub-region 112b having a different composition than that of said intermediate sub-region 112b.

The metal region and the first sub-region 112a are provided preferably so that the difference between the work function of their respective materials is such that the metal region and the first semi-conductor sub-region 112a form a Schottky type contact also called "rectifying contact". The metal region 111 is advantageously formed of a metallic material or a metal with a high work function, for example around 5.2 eV, for example such as Nickel. The use of such type of metal makes it possible to keep a satisfactory drain current level. Alternatively, other types of metals such as Ohmic contact to p-GaN, Pt, TiN or W may be used to form metal region 111 to reduce gate leakage current.

As will be seen later, the composition of the semiconductor region 112 allows the use, for metal region 111, of a metal having a high work function without degrading gate leakage current, even for higher gate voltages, for example gate voltages of 6 volts.

The HEMT transistor is typically a N-type channel transistor. Thus, the first sub-region 112a is typically a P-type semi-conductor region and may be made of P-doped GaN (hereafter noted "p-GaN"). P-type doping can be obtained for example using Mg as a dopant. The Mg concentration in said first sub-region 112a is preferably between $5 \times 10^{18}$ and $1.0 \times 10^{19}$ cm$^{-3}$, and more preferably between $7.5 \times 10^{18}$ and $1.0 \times 10^{19}$ cm$^{-3}$, for example $1.0 \times 10^{19}$ cm$^{-3}$. The thickness of the first sub-region 112a may be between approximately 20 nm and 30 nm, for example 20 nm.

The second sub-region 112c that is in contact with the second layer 106, is also typically a P-doped semi-conductor region and may be made of GaN as well. The concentration of dopant and thickness in said second sub-region 112c may be the same as that of sub-region 112a.

A particular feature of the gate electrode 110 is that the intermediate sub-region 112b arranged between first sub-region 112a and second sub-region 112c are P-type doped regions, is un-doped or unintentionally doped semi-conductor. The intermediate sub-region 112b may be made of GaN as well, the un-doped GaN region being in this case noted "u-GaN".

It may also be P-doped but with a low concentration of dopant, this concentration being lower than that of said first sub-region 112a and said second sub-region 112c. The dopant concentration in the intermediate region 112b is in this case typically provided at least 10 times lower and preferably at least 100 times than that in said first and second sub-regions 112a, 112c and more preferably at least 1000 times lower than that in said first and second sub-regions 112a, 112c. The intermediate region 112b that is most preferably un-doped or unintentionally doped or that may be lightly P-doped, is provided so as to increase potential barrier at p-GaN/AlGaN interface for preventing electron high injection from channel to gate metal, especially at high voltages while maintaining a sufficient drain current.

By "low concentration" in said intermediate region 112b, it is meant a concentration of dopant that is preferably lower than $5 \times 10^{17}$ cm$^{-3}$ and more preferably lower than $1 \times 10^{17}$ cm$^{-3}$.

By "unintentionally doped", it is meant that this region 112b may be formed without any doping step, for example by epitaxy without in situ doping or subsequent implant, and the dopant concentration being then typically lower than $1 \times 10^{16}$ cm$^{-3}$.

The thickness of the intermediate sub-region 112b may be provided between approximately 10 nm and 30 nm, preferably between 20 nm and 30 nm, for example 30 nm.

As an alternative to GaN, one may use AlGaN to form the semi-conductor region 112 of the gate. Thus, the sub-regions 112a, 112c may be P-type AlGaN, whereas the intermediate region 112b is undoped or unintentionally doped, or low doped AlGaN.

Regarding its dimensions, the gate 110 may be provided with a width $W_G$ (smallest dimension measured in a plane parallel to the [O; x; y] plane given in FIG. 2) comprised between 1 and 5 μm, for example 2 μm.

Preferably, the gate electrode 110 is decentered from a median between the source 107 electrode and the drain 108 electrode, so that the gate 110 is located closer to the source electrode 107 than to the drain electrode 108. The distance $L_{GS}$ between the source electrode 107 and the gate electrode 110 may for example be of the order of 2 μm, while the distance $L_{GD}$ between the gate 110 and the drain electrode 108 can be of the order of 13.5 μm.

Figure 1A:
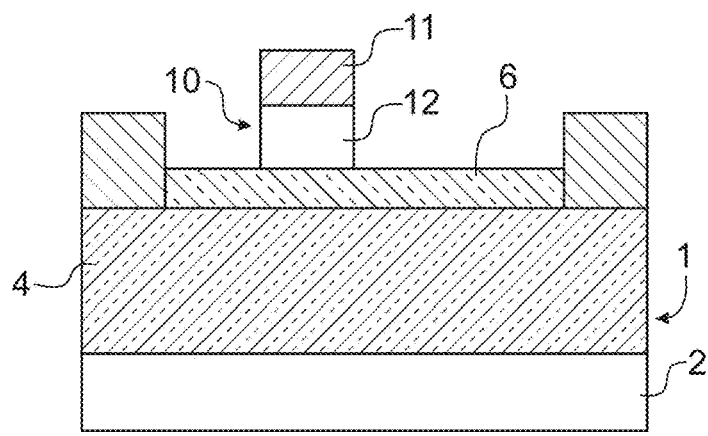
FIGS. 1A, 1B illustrate HEMT transistor structures according to prior art°.
Figure 1B:
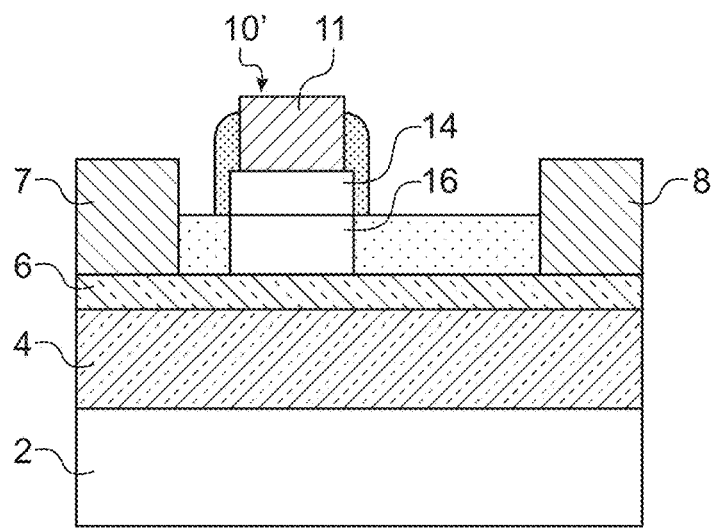

FIGS. 3A, 3B, 3C give different electrical characteristics of:
- a HEMT transistor similar to that above-described;
- a transistor, called "first conventional transistor", provided with a gate structure according to prior art and as disclosed in relation with FIG. 1A, i.e. with a P-doped GaN gate;
- a transistor, called "second conventional transistor", provided with a structure as disclosed in relation with FIG. 1B and having a NP junction under the gate contact.

In this particular example, the transistor implemented according to an embodiment of the invention has a first layer 104 that is a 4 μm GaN layer, a second layer 106 that is a 15 nm Al$_{0.25}$Ga$_{0.75}$N, a gate upper region 111 made of a Nickel and contacting a 70 nm semi-conductor semiconductor region 112. This region 112 is made of a stack comprising a P-doped GaN sub-region 112a, an un-doped GaN intermediate sub-region 112b, a P-doped GaN sub-region 112c, $L_{GS}$=2 μm, $L_{GD}$=13.5 μm, $W_G$=2 μm, Mg doping of sub-regions 112a, 112c being such that the dopant concentration is $1 \times 10^{19}$ cm$^{-3}$. The first conventional transistor and the second conventional transistor are provided with the same above given dimensions ($L_{GS}$=2 μm, $L_{GD}$=13.5 μm, $W_G$=2 μm), same dopant concentration ($1 \times 10^{19}$ cm$^{-3}$) for the P-doped region and same semi-conductor thickness (70 nm) under the gate metal.

In FIG. 3A, representing the drain current as a function of the gate source voltage when the drain source voltage is 1 volt, one can note that first conventional transistor (curve $C_{31}$) has a threshold voltage of 1.45 V and a drain current at $V_{GS}$=8 V that is 91.3 mA/mm, whereas the transistor according to the invention (curve $C_{32}$) has a similar threshold voltage and a drain current at $V_{GS}$=8 V of approximately 89.5 mA/mm which is close to that of first conventional transistor. The second conventional transistor (curve $C_{33}$) has a higher threshold voltage to 1.62 V.

In FIG. 3B, giving the gate current evolution as a function of the gate source voltage, one can note that the gate current leakage for the transistor according to the invention (curve $C_{35}$) is much reduced compared to that of first conventional transistor (curve $C_{34}$) and is the same as for the second conventional transistor (curve $C_{36}$) when $V_{GS}$ is less than 4 volts. The gate structure with p-GaN/u-GaN/p-GaN stack enables to reduce gate leakage current from $1.8\times10^{-7}$ A/mm to $8.6\times10^{-12}$ A/mm at $V_{GS}$=+8.0 V compared to a p-GaN/n-GaN stack. In the conventional first structure depletion width between metal/p-GaN increases, which means lower hole injection from gate and electron injection from channel. In the structure according to the invention potential barrier at p-GaN/AlGaN interface is raising due to p-i-p-n diode biasing. This higher potential barrier leads to lower electron injection from channel. It thus results in a reduced gate current.

In FIG. 3C giving the maximum transconductance $g_m$ as a function of the gate source voltage, one can note that the maximum transconductance $g_m$ of the second conventional transistor (curve $C_{39}$) is much reduced compared to that (curve $C_{38}$) of the transistor according to the invention and close to that of the first conventional transistor (curve $C_{37}$).

Figure 4:
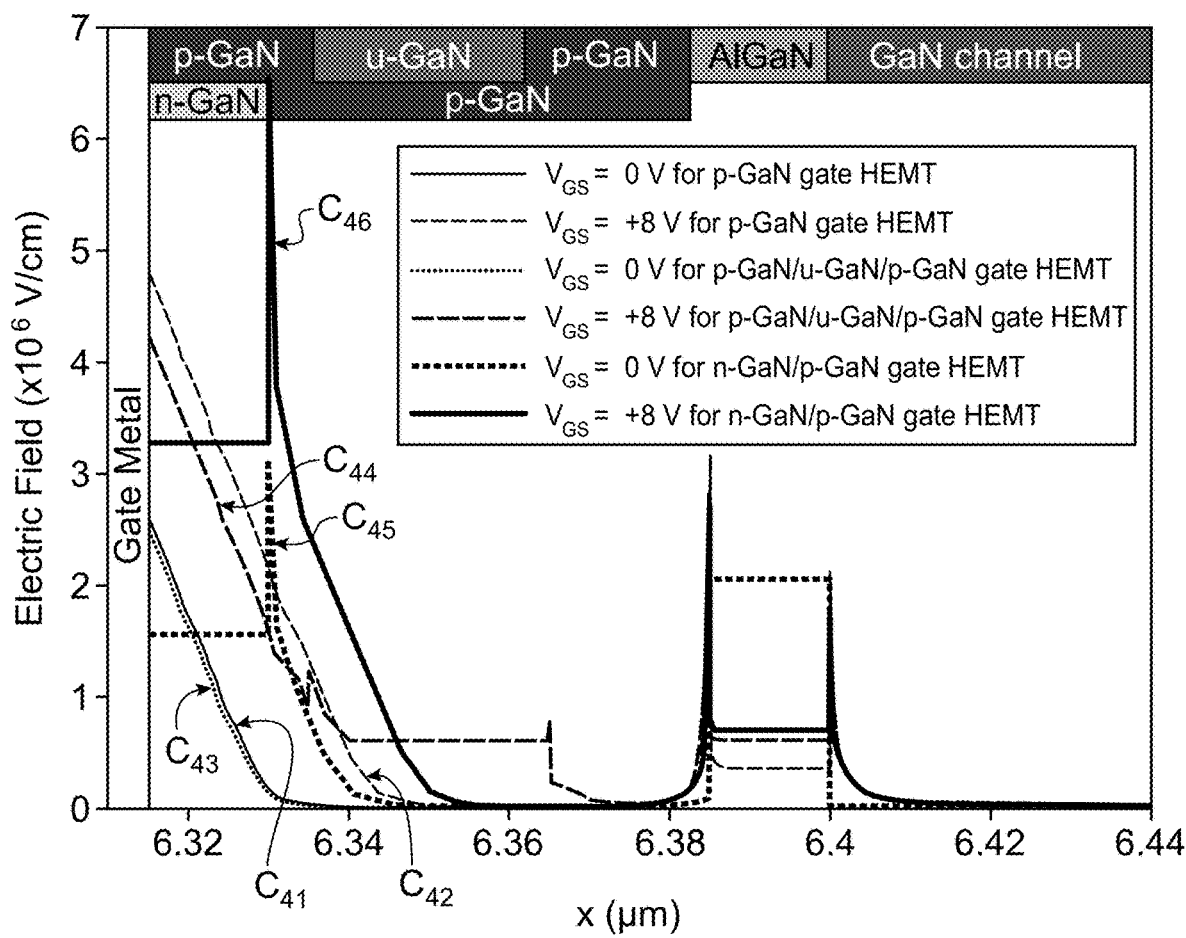
FIG. 4 give electric field estimates at different points in a structure according to an embodiment of the invention and in structures according to prior art°.

In FIG. 4, the evolution of the electric field as a function of the positioning in the structure, is given for the transistor according to the invention respectively when the source gate voltage is 0 Volt (curve $C_{43}$) and when it is 8 Volt (curve $C_{44}$). Same type of distribution is given for the first conventional transistor (curves $C_{41}$, $C_{42}$) and for the second conventional transistor (curves $C_{45}$, $C_{46}$). One can note that the second conventional structure has a very high electric field when the gate source voltage is equal to 8 volts (curve $C_{46}$). This may degrade its gate reliability. The electric field below the gate of the transistor according to the invention and provided with a p-GaN/u-GaN/p-GaN stack is, at $V_{GS}$=8.0 V, lower than that of conventional first structure. The junction electric fields at p-GaN/u-GaN and p-GaN/AlGaN interfaces are lower than conventional first structure. This results in higher gate reliability.

Figure 5A:
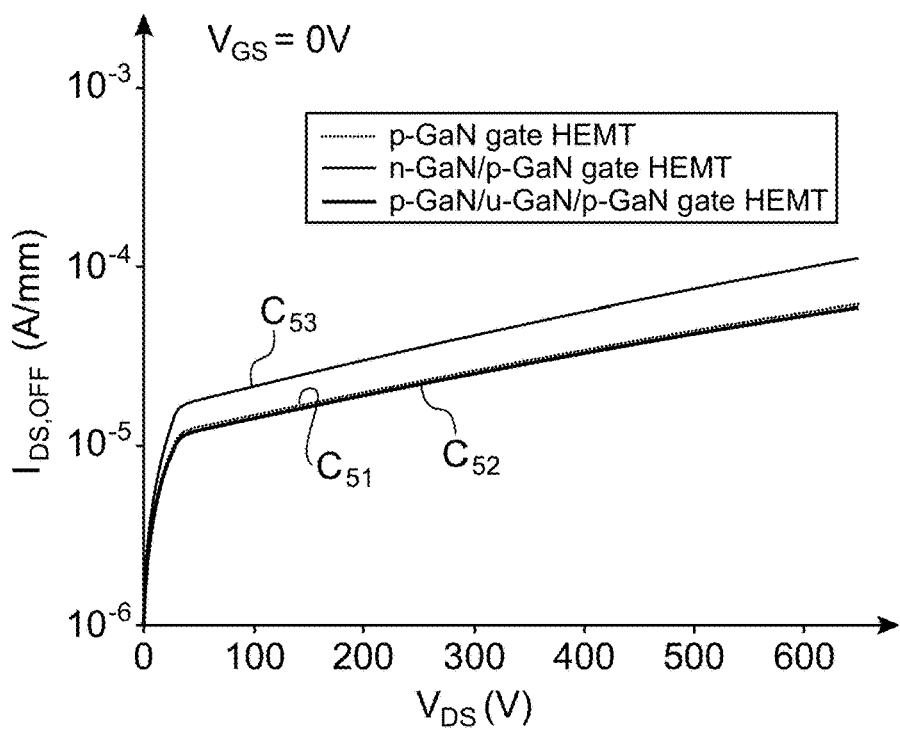
FIGS. 5A, 5B give different "OFF-state" electrical characteristics of a HEMT transistor according to the invention and of transistors according to prior art°.
Figure 5B:
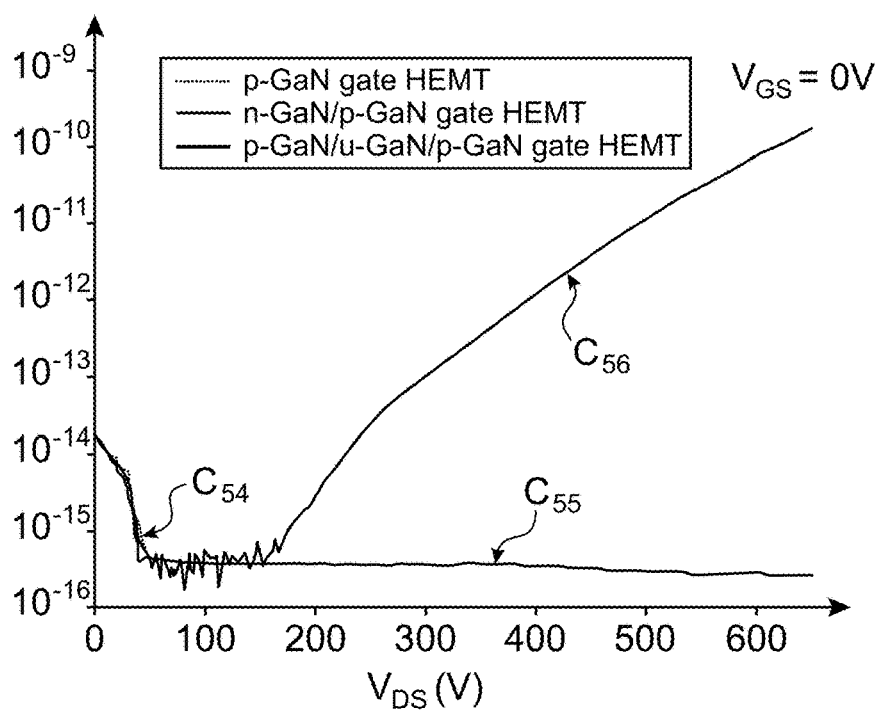

FIGS. 5A-5B, give a comparison of the OFF state currents as a function of the drain source voltage for the 3 above-mentioned transistors.

In FIG. 5A, curves $C_{51}$, $C_{52}$, $C_{53}$ are representative of the OFF-state drain current, respectively for said first conventional transistor, for the transistor according to the particular embodiment of the invention, and for said second conventional transistor.

In FIG. 5B, one can note that second conventional transistor (curve $C_{56}$) has an OFF-state gate current that is increased when increasing the drain-source voltage and that is much higher than that of transistor (curve $C_{55}$) according to the particular embodiment of the invention.

Figure 6A:
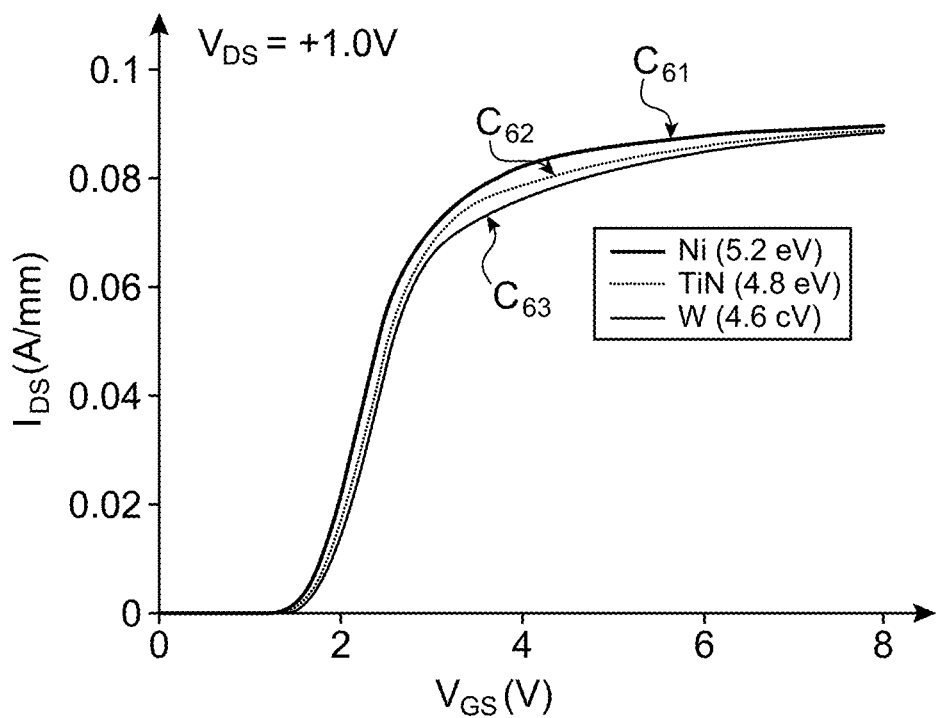
FIGS. 6A, 6B give different current characteristics of a HEMT transistor according to an embodiment of the invention for different compositions of its metal gate contact°.
Figure 6B:
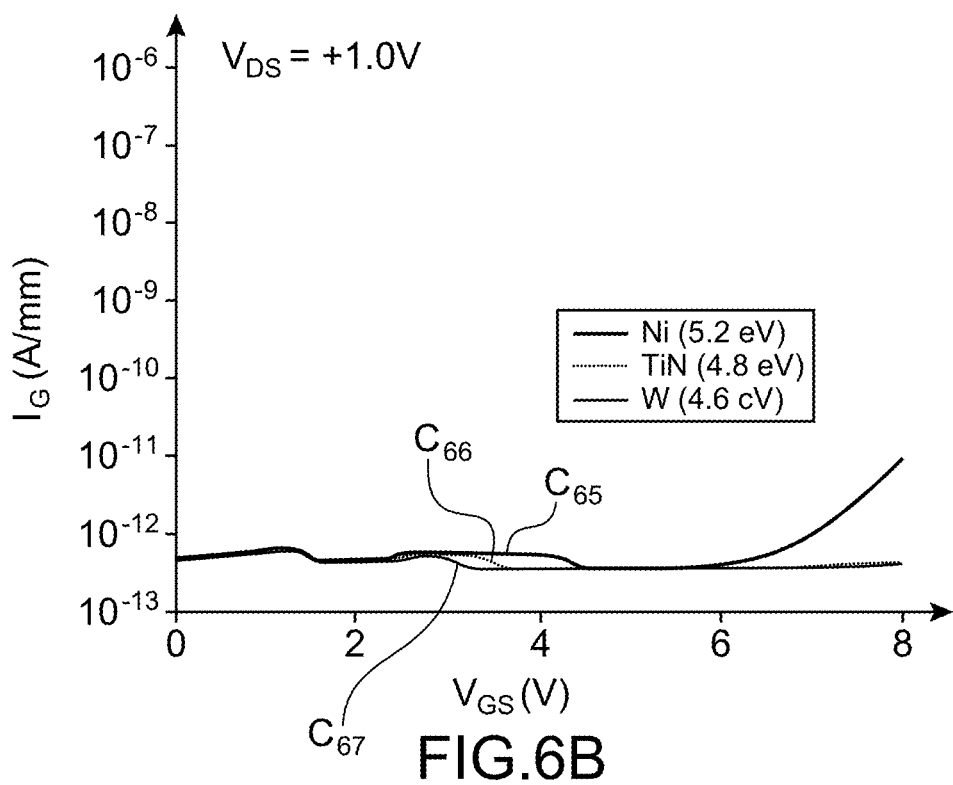

In FIGS. 6A and 6B drain current and gate leakage current of the transistor structure according to said particular embodiment are now respectively represented both as a function of the gate source voltage for a drain source voltage of 1 Volt, this for different compositions of the upper region of the gate, the upper region 111 being either made of Nickel (curves $C_{61}$, $C_{65}$), or made of TiN (curves $C_{62}$, $C_{66}$), or made of W (curves $C_{63}$, $C_{67}$). It shows that if lower work-function metals such as W and TiN are used, there is no increase in gate leakage current even in higher gate voltages. Thus, the upper region 111 allows to use high metal work-function metals such as Nickel so that the drain current level can be maintained.

Figure 7:
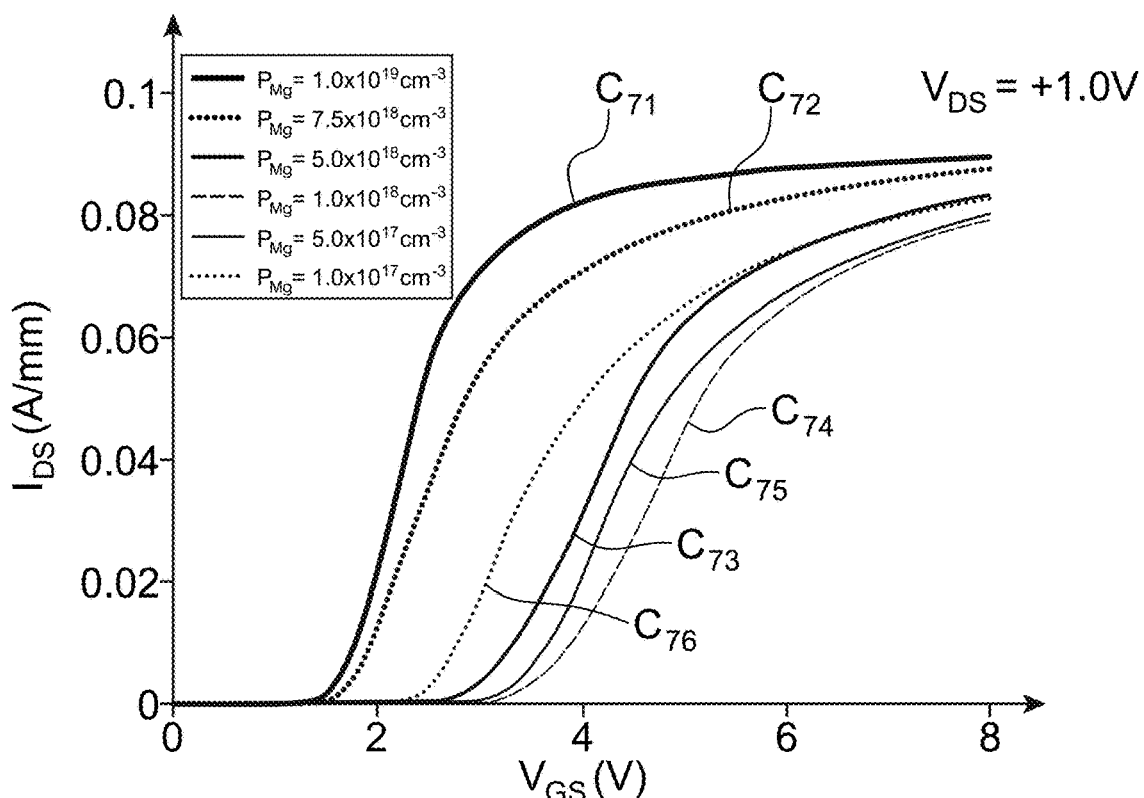
FIGS. 7, 8 give different current characteristics of a HEMT transistor according to an embodiment of the invention for different Mg concentrations of the P-doped regions in the semi-conductor part of its gate°.
Figure 8:
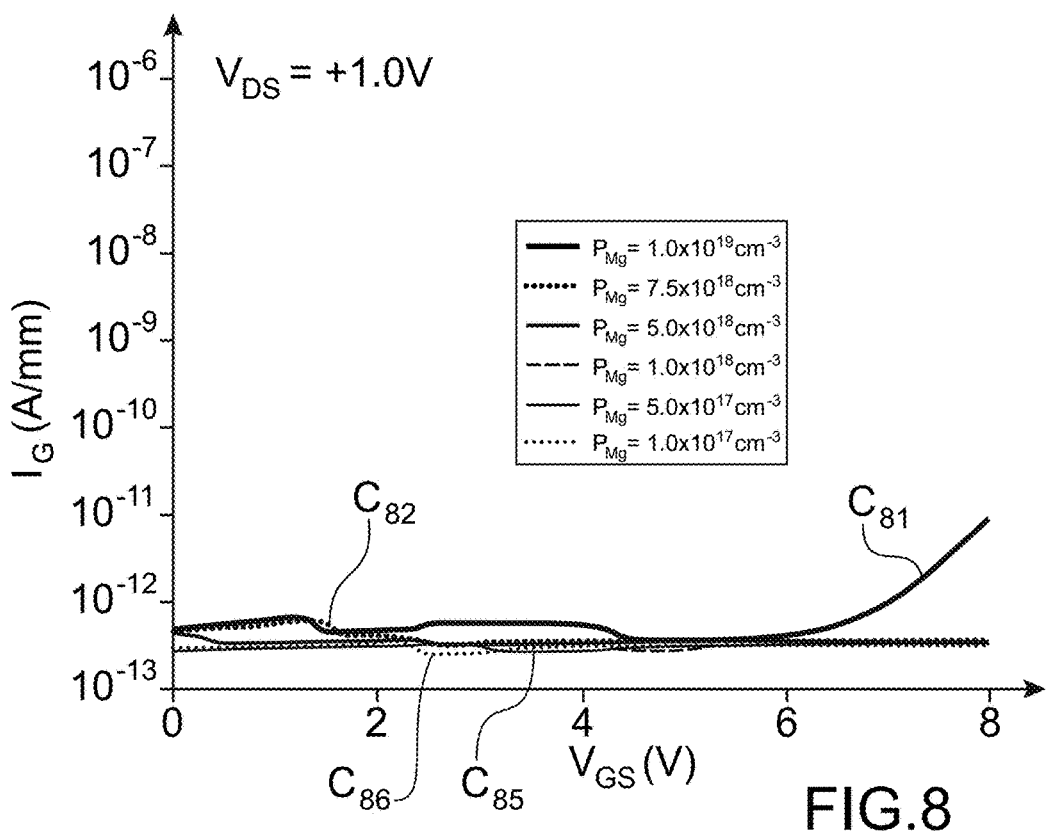

In FIGS. 7 and 8, drain current and gate leakage current of a transistor having a structure similar to that according to said particular embodiment, is represented for different concentrations of dopant (Mg) in the sub-regions 112a, 112c, $C_{71}$ and $C_{81}$, corresponding to an Mg concentration of $1*10^{19}$ cm$^{-3}$, $C_{72}$ and $C_{82}$ corresponding to an Mg concentration of $7.5*10^{18}$ cm$^{-3}$, $C_{73}$ and $C_{83}$ corresponding to an Mg concentration of $5*10^{18}$ cm$^{-3}$, $C_{74}$ and $C_{84}$ to $1*10^{18}$ cm$^{-3}$, $C_{75}$ and $C_{85}$ to $5*10^{17}$ cm$^{-3}$, $C_{96}$ and $C_{106}$ to $1*10^{17}$ cm$^{-3}$. Sub-regions 112a, 112c are thus provided preferably with an Mg concentration below or $1\times10^{19}$ cm$^{-3}$ in order to keep low gate current leakage current even for Vgs values higher than 6 volts.

Figure 9A:
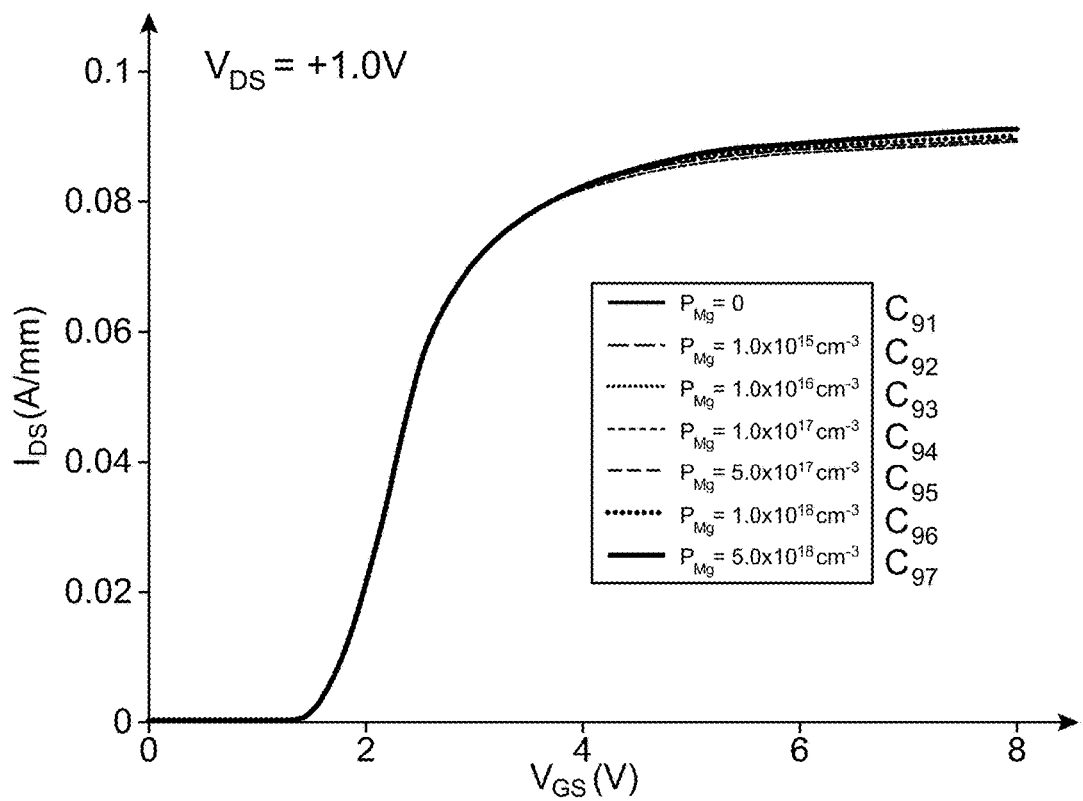
FIGS. 9A, 9B show different current characteristics of a HEMT transistor according to an embodiment of the invention for different Mg concentrations of a low-doped region in the semi-conductor part of its gate°.
Figure 9B:
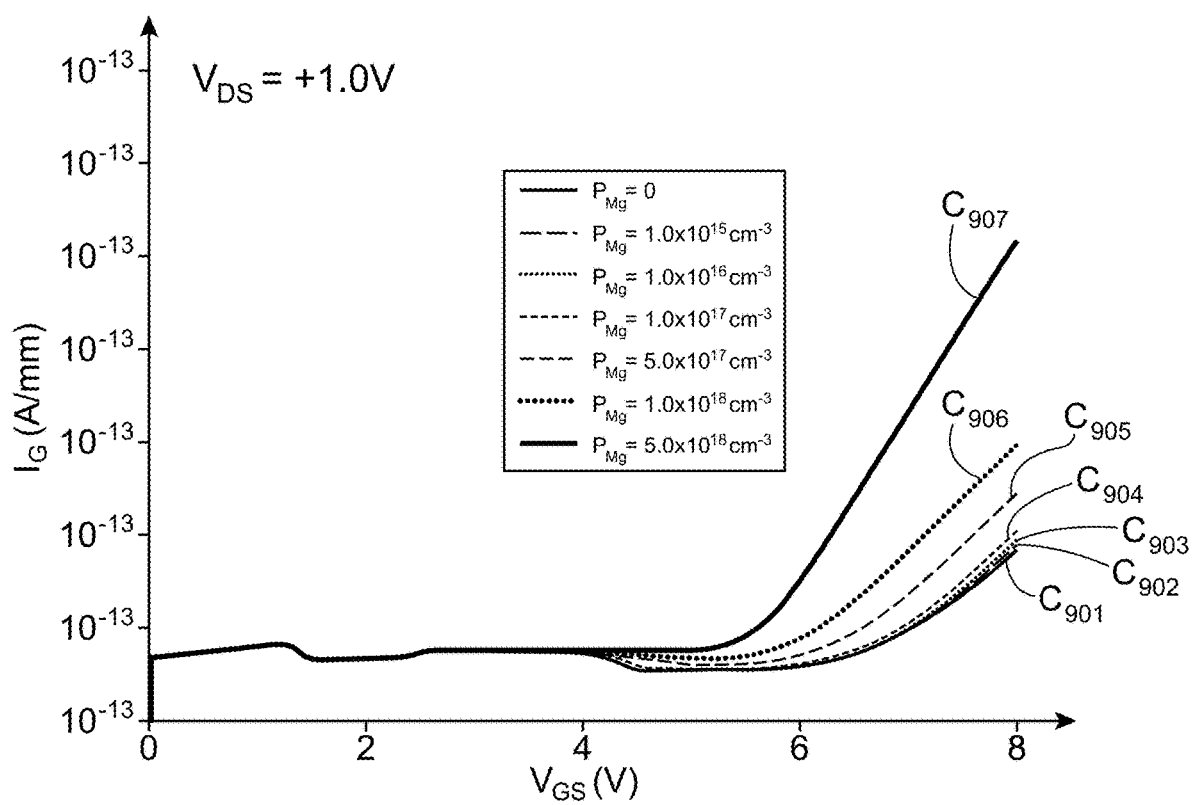
Figure 10:
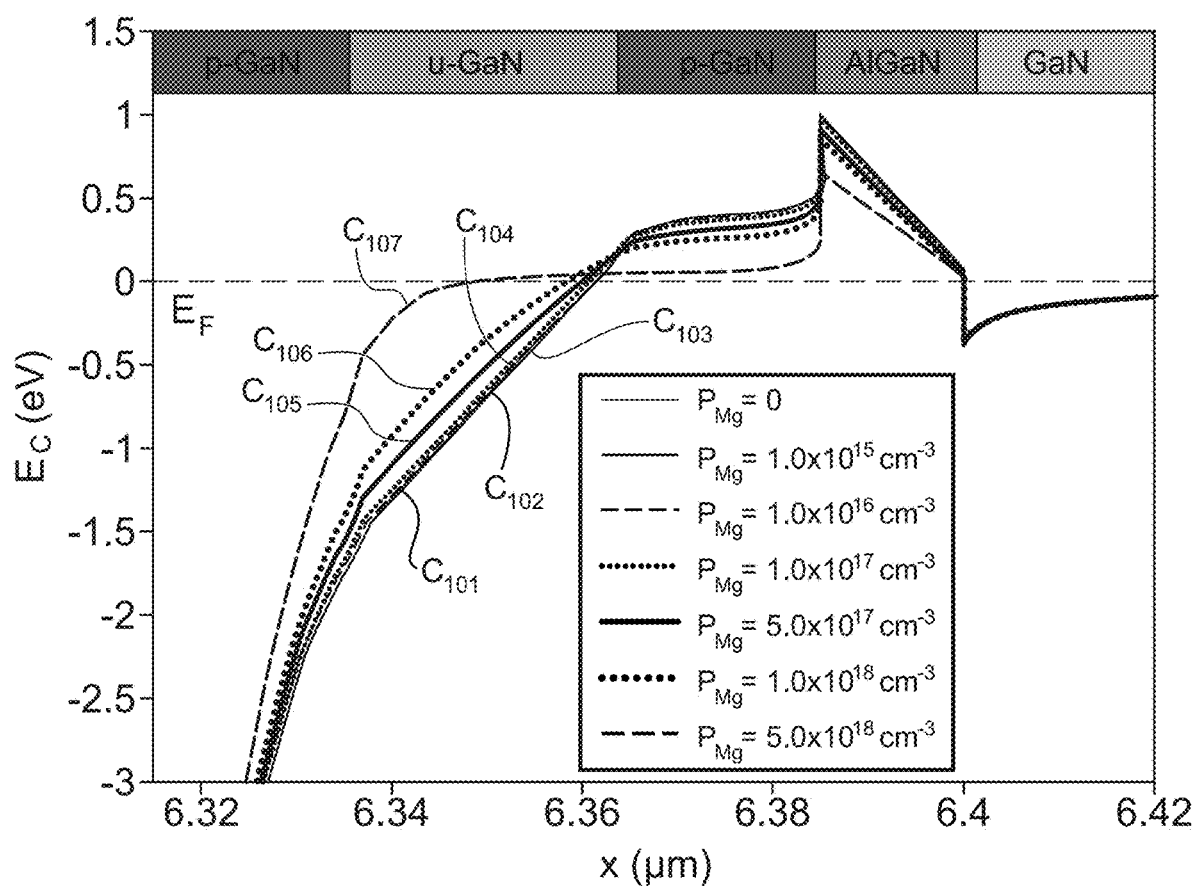
FIG. 10 gives barrier potential evolution in a transistor structure according to the invention for different Mg concentrations°.

In FIGS. 9A and 9B drain current and gate leakage current of a transistor having a structure similar to that according to said particular embodiment, are represented for different concentrations of dopant (Mg) in the intermediate region 112b, $C_{91}$ and $C_{901}$, corresponding respectively to an Mg concentration of 0, $C_{92}$ and $C_{902}$, to $1*10^{15}$ m$^{-3}$, $C_{93}$ and $C_{903}$ to $1*10^{16}$ cm$^{-3}$, $C_{94}$ and $C_{904}$ to $1*10^{17}$ cm$^{-3}$, $C_{95}$ and $C_{905}$ to $5*10^{17}$ cm$^{-3}$, $C_{96}$ and $C_{906}$ to $1*10^{18}$ cm$^{-3}$, $C_{97}$ and $C_{907}$ to $5*10^{18}$ cm$^{-3}$. FIG. 10 gives the potential barrier when Vgs=8 Volt, for the same transistor and the same concentrations of Mg (curves $C_{101}$, $C_{102}$, $C_{103}$, $C_{104}$, $C_{105}$, $C_{106}$, $C_{107}$). An intermediate region 112b with low Mg concentrations still allows to obtain low gate leakage current, (i.e. below than $1\times10$–10 A/mm) in this case until an Mg concentration of $5\times10^{17}$ cm$^{-3}$.

Figure 11A:
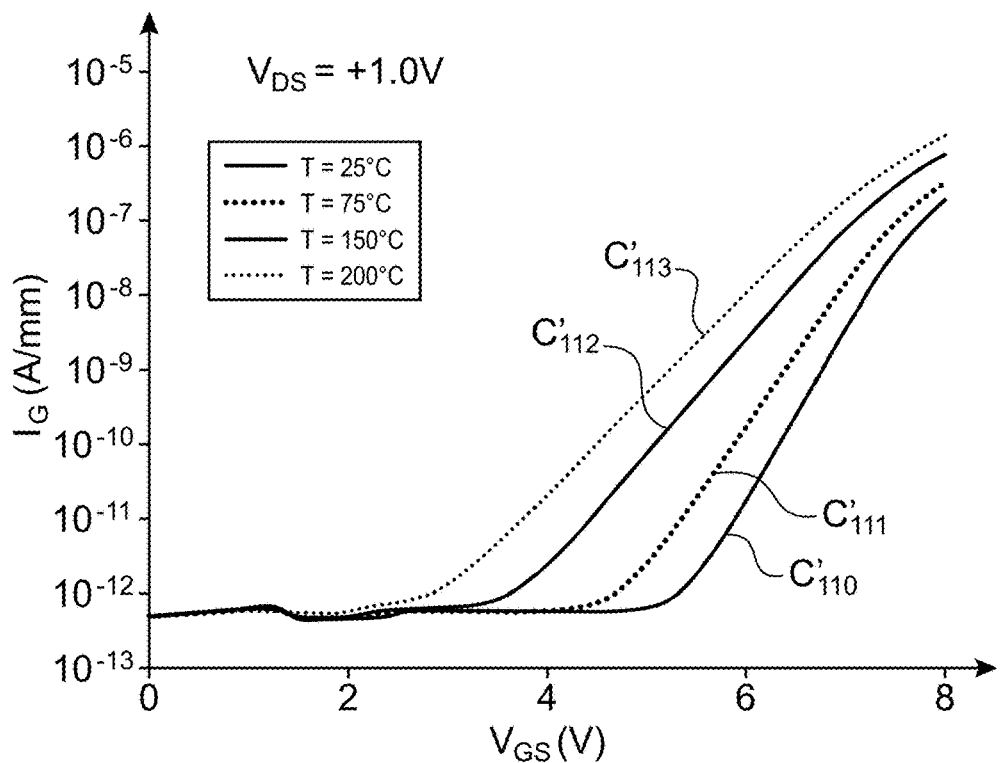
FIGS. 11A, 11B give gate leakage current characteristics respectively for a transistor according to prior art and for a HEMT transistor according to an embodiment of the invention, this for different operating temperatures°.
Figure 11B:
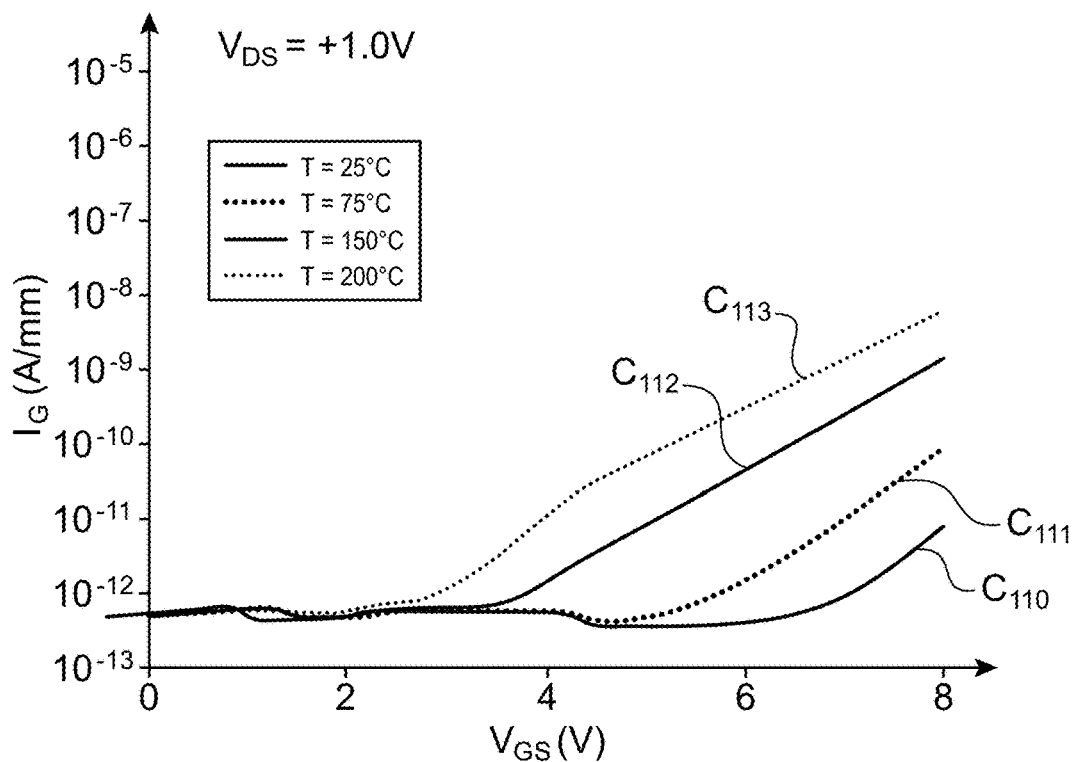

FIGS. 11A and 11B give the evolution of the gate leakage current for different operating temperatures and a comparison between a transistor with the first prior art structure (curves $C'_{110}$, $C'_{111}$ $C'_{112}$, $C'_{113}$) having a structure similar to that according to said particular embodiment (curves $C_{110}$, $C_{111}$, $C_{112}$, $C_{113}$).

With a transistor according to the invention, a gate leakage current as low as $6\times10^{-9}$ A/mm at $V_{GS}$=+8 V may be obtained even with temperatures up to 200° C. Even with such temperature, the leakage current remains lower than that of the transistor of conventional first structure having a semi-conductor part of the gate that is only made of p-GaN.

Figure 12A:
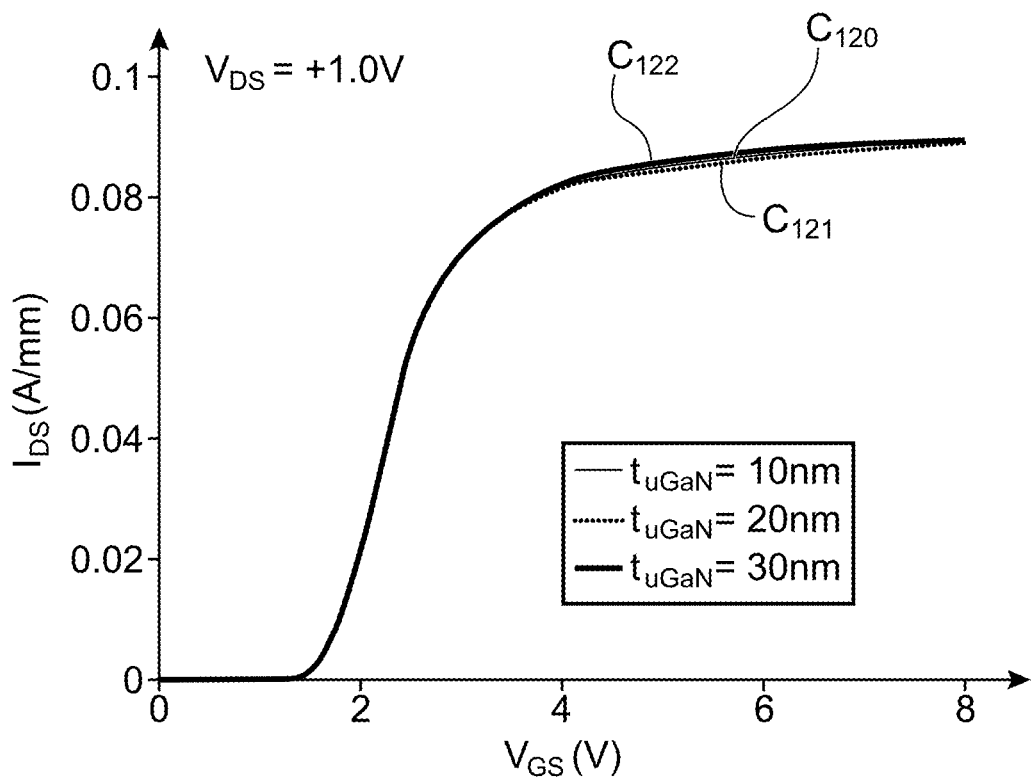
FIGS. 12A, 12B show different current characteristics of a HEMT transistor according to an embodiment of the invention for different thicknesses of an un-doped region provided in the semi-conductor part of its gate°.
Figure 12B:
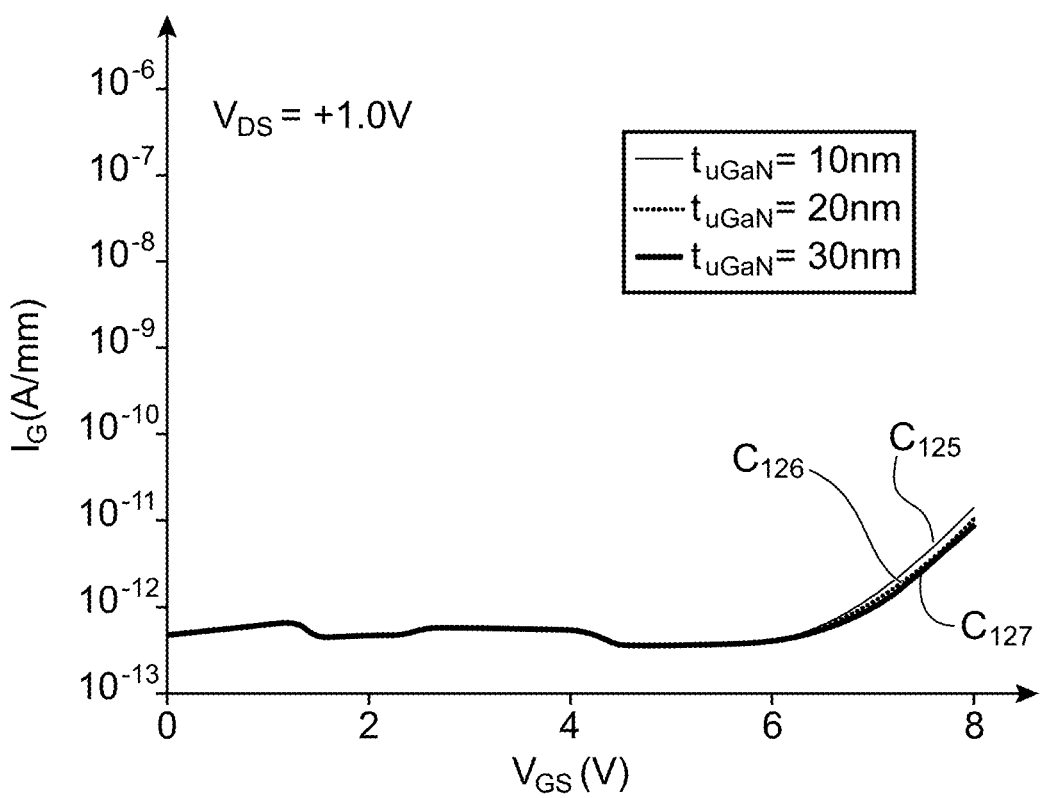

FIGS. 12A and 12B respectively show drain current and gate leakage current of the transistor according to said particular embodiment for different thicknesses (resp. 10 nm, 20 nm, 30 nm) of the intermediate region 112b of the gate structure that is un-doped or unintentionally doped. Curve $C_{127}$ corresponding to an intermediate region 112b of 30 nm confirms that gate leakage is reduced as the thickness of the intermediate region 112b is increased due to larger depletion width and higher potential barrier at the interface between second sub-region 112 of the gate and second layer 106.

An example of a method for fabricating a HEMT transistor as described above is now given.

The first layer 104 is typically made by epitaxial growth of GaN on the substrate 102.

The second layer 106 of AlGaN can then formed via epitaxy on the first layer 104. A first passivation dielectric layer may then deposited on the second layer 106. This first passivation dielectric layer is for example a silicon nitride layer.

Etching of the first passivation dielectric layer may then be implemented in order to form first and second openings through the first passivation dielectric layer, these openings forming accesses to the second semi-conductor layer 106. Source and drain contacts 107, 108 may be fabricated in the openings by depositing at least a metal layer that is subsequently etched.

A second passivation dielectric layer is then deposited and covers the source and drain contacts 107, 108 and the first passivation dielectric layer.

A portion of the second passivation dielectric layer and the first passivation dielectric layer is etched in order to form a third opening and to provide an access to the second semi-conductor layer 106.

Then, the gate can be formed in said third opening.

The fabrication of the gate comprises forming a p-doped GaN layer on a region of said second layer 106 that is not covered by passivation and exposed by said third opening. The p-doped GaN layer may be obtained via epitaxial growth. The doping may be conducted during epitaxy growth by in situ doping using Mg as a dopant.

On the doped GaN layer, an un-doped or unintentionally doped is then formed, typically by epitaxy growth. Alternatively, a light doping is conducted with an Mg concentration lower than $5*10^{17}$ cm$^{-3}$ and preferably with an Mg concentration lower than $1*10^{17}$ cm$^{-3}$.

Another p-doped GaN layer on the un-doped or low-doped GaN layer is then formed, typically via epitaxial growth on a region exposed by said third opening. The doping may be conducted during epitaxy growth by in situ doping.

Then the metallic upper region 111 of the gate is formed by depositing a metal layer such as Ni and etching.

The invention claimed is:

1. A normally off field-effect transistor of High Electron Mobility Transistor (HEMT) type, comprising:
   a source electrode,
   a drain electrode,
   a channel region formed in a semiconductor block, said semiconductor block being provided with an heterostructure and comprising at least a first semiconductor layer of a first semiconductor material having a first band gap and a second semiconductor layer of a second semiconductor material having a second band gap, and
   a conductive gate to control a current flow between the source electrode and the drain electrode, the conductive gate being composed of a metallic upper region contacting a lower semi-conductor region, said lower semi-conductor region being formed of:
      a first sub-region that is P-type and in contact with said upper region,
      a second sub-region that is P-type and in contact with said second layer, and
      an intermediate sub-region arranged between said first sub-region and said second sub-region, said intermediate sub-region being P-doped with a concentration of dopants being lower than $1*10^{17}$ cm$^{-3}$ and being 1000 times lower than that of said first sub-region and the second sub-region, respectively.

2. The transistor according to claim 1, wherein said first layer is a GaN layer.

3. The transistor according to claim 1, wherein said second layer is an AlGaN layer.

4. The transistor according to claim 1, wherein lower semiconductor region is a GaN region.

5. The transistor according to claim 1, wherein said intermediate sub-region contains Mg as dopant.

6. The transistor according to claim 1, wherein said first sub-region and said second sub-region contain Mg as dopant,
   an Mg concentration in said intermediate sub-region being at least 100 times lower than an Mg concentration in said first sub-region and said second sub-region,
   the Mg concentration in said first sub-region and said second sub-region being comprised between $5\times10^{18}$ and $1\times10^{19}$ cm$^{-3}$.

7. The transistor according to claim 1, wherein said intermediate sub-region has a thickness between 10 and 30 nm.

8. The transistor according to claim 7, wherein said intermediate sub-region has a thickness comprised between 20 and 30 nm.

9. The transistor according to claim 1, wherein said upper region is provided with a metal.

10. The transistor according to claim 9, wherein said upper region is provided with Nickel.

11. A normally off field-effect transistor of High Electron Mobility Transistor (HEMT) type, comprising:
    a source electrode,
    a drain electrode,
    a channel region formed in a semiconductor block, said semiconductor block being provided with an heterostructure and comprising at least a first semiconductor layer of a first semiconductor material having a first band gap and a second semiconductor layer of a second semiconductor material having a second band gap, and
    a conductive gate to control a current flow between the source electrode and the drain electrode, the conductive gate being composed of a metallic upper region contacting a lower semi-conductor region, said lower semi-conductor region being formed of:
       a first sub-region that is P-type and in contact with said upper region,
       a second sub-region that is P-type and in contact with said second layer, and
       an intermediate sub-region arranged between said first sub-region and said second sub-region, said intermediate sub-region being unintentionally doped,
    wherein said first sub-region and said second sub-region contain Mg as dopant,
    an Mg concentration in said intermediate sub-region being at least 100 times lower than an Mg concentration in said first sub-region and said second sub-region, and
    the Mg concentration in said first sub-region and said second sub-region being between $5\times10^{18}$ and $1\times10^{19}$ cm$^{-3}$.

* * * * *